(12) United States Patent
Cabahug et al.

(10) Patent No.: US 6,391,687 B1
(45) Date of Patent: May 21, 2002

(54) COLUMN BALL GRID ARRAY PACKAGE

(75) Inventors: Elsie A. Cabahug, Mandaue; Consuelo Tangpuz, Lapulapu, both of (PH)

(73) Assignee: Fairchild Semiconductor Corporation, DE (US)

( * ) Notice: Subject to any disclaimer, the term of this patent is extended or adjusted under 35 U.S.C. 154(b) by 0 days.

(21) Appl. No.: 09/703,474

(22) Filed: Oct. 31, 2000

(51) Int. Cl.[7] .......................... H01L 21/44; H01L 21/48; H01L 21/50; H01L 23/495

(52) U.S. Cl. ...................... 438/123; 257/666; 438/612

(58) Field of Search ............................ 438/123, 612; 257/666

(56) References Cited

U.S. PATENT DOCUMENTS

| | | | | |
|---|---|---|---|---|
| 5,569,955 A | * | 10/1996 | Chillara et al. | 257/666 |
| 5,663,593 A | * | 9/1997 | Mostafazedeh et al. | 257/666 |
| 5,976,914 A | * | 11/1999 | Abbott et al. | 438/123 |
| 6,114,187 A | * | 9/2000 | Hayes | 438/106 |

* cited by examiner

*Primary Examiner*—Charles Bowers
*Assistant Examiner*—William C Vesperman
(74) *Attorney, Agent, or Firm*—Townsend and Townsend and Crew LLP

(57) ABSTRACT

A semiconductor device including a substantially flat leadframe that includes a die attach area on a surface of the leadframe. A die including solder bumps is placed thereon and a plurality of columns surround at least a portion of the periphery of the die attach area. The die is positioned within the die attach area and the columns have a height substantially equal to the solder bumps and the die on the leadframe.

12 Claims, 3 Drawing Sheets

COLUMN BALL GRID ARRAY PACKAGE

BACKGROUND OF THE INVENTION

1. Field of the Invention

The present invention relates to a semiconductor device, and more particularly, to packaging techniques for semiconductor devices that include a leadframe that utilizes columns to facilitate electrical connections.

2. Description of the Prior Art

Semiconductor devices generally include a leadframe and a bumped die attached thereto. Many of the packages are multiple pieces and rely on wire bonding as the interconnect between the die and the package. Additionally, many BGA (Ball Grid Array) substrates do not have the capability for solder balls to be pre-attached.

The prior art packages limit the ability to form thin packages. Additionally, the manufacturing processes for prior art packages are inefficient.

SUMMARY OF THE INVENTION

The present invention provides a semiconductor device that includes a die and a leadframe. The leadframe includes a die attach area on a surface of the leadframe and a plurality of columns around at least a portion of the periphery of the die attach area. The die is positioned within the die attach area and is attached thereon. The columns have a height substantially equal to solder bumps on the die when the die is on the leadframe.

In accordance with one aspect of the present invention, the leadframe comprises a Cu-based material.

In accordance with another aspect of the present invention, the leadframe includes a Ni—Pd plating on the surface.

In accordance with a further aspect of the present invention, the columns are made up of metal studs grown from the leadframe that include a solderable coating.

In accordance with yet another aspect of the present invention, the leadframe includes notches defined in the surface around the periphery and the columns consist of solder placed in the notches.

Accordingly, the present invention provides a semiconductor device wherein the package allows for directly attaching a die onto the leadframe using conventional soft solder die attach process. When the package is used to house, for example, a discrete power MOSFET, the solder bumps on the die act as the source and gate connections to the printed circuit board (PCB) while the solderable columns on the leadframe act as the drain interconnect. The package design results in less complicated substrate processing and still maintains the package stand-off height less than 1 millimeter, which is compatible to that of existing MOSFET BGA packages.

Other features and advantages of the present invention will be understood upon reading and understanding the detailed description of the preferred exemplary embodiments found herein below, in conjunction with reference to the drawings, in which like numerals represent like elements.

DETAILED DESCRIPTION OF THE PREFERRED EXEMPLARY EMBODIMENTS

Figure 1:
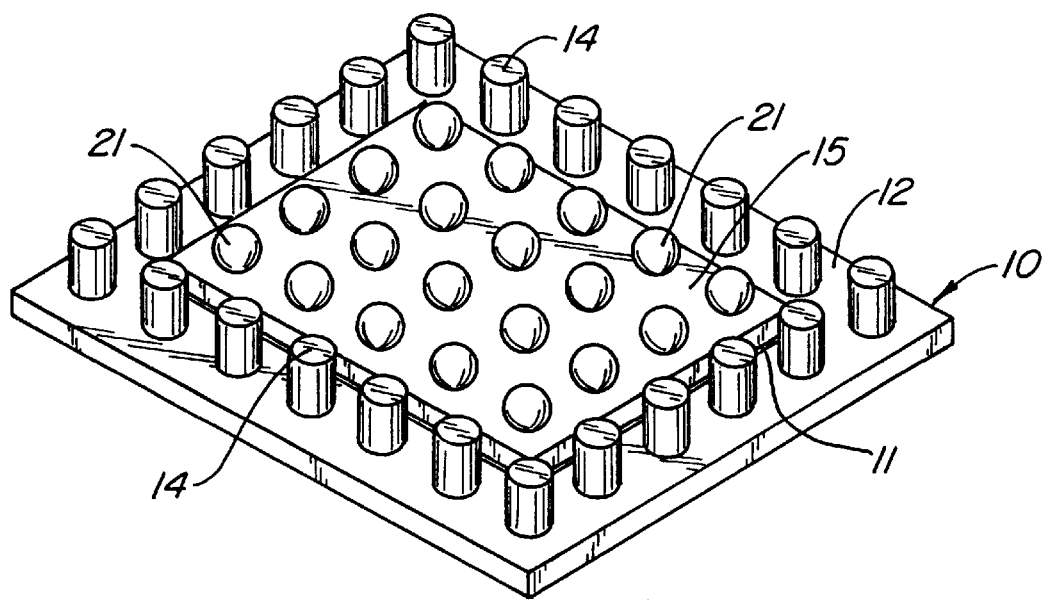
FIG. 1 is a perspective schematic view of a semiconductor package in accordance with one embodiment of the present invention.
Figure 3:
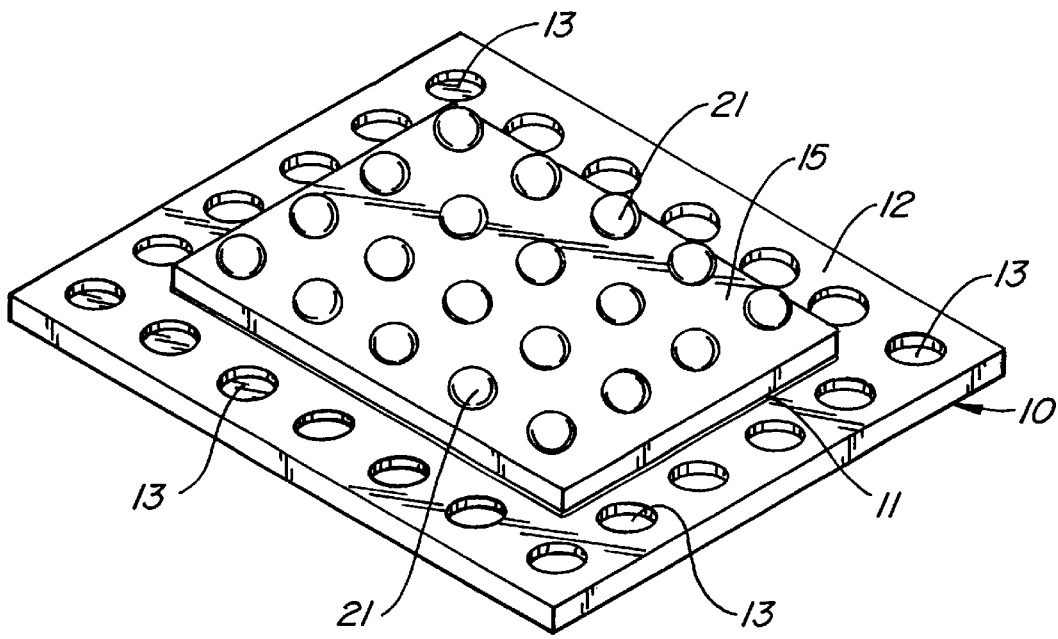
FIG. 3 is a perspective view of a leadframe with a die attached thereto for use in the semiconductor package illustrated in FIG. 1.

FIG. 1 illustrates a leadframe 10 for use in manufacturing a semiconductor device in accordance with the present invention. The leadframe includes a die attach area 11 on the die pad 12 of the leadframe. In the embodiment illustrated in FIG. 1, the surface includes a plurality of notches 13 defined around the periphery of the die attach area as can be seen in FIG. 3. FIG. 3 more clearly illustrates the surface of the leadframe with the notches defined therein. As can be seen in the figures, a plurality of solder columns 14 are placed in the plurality of notches.

Figure 6:
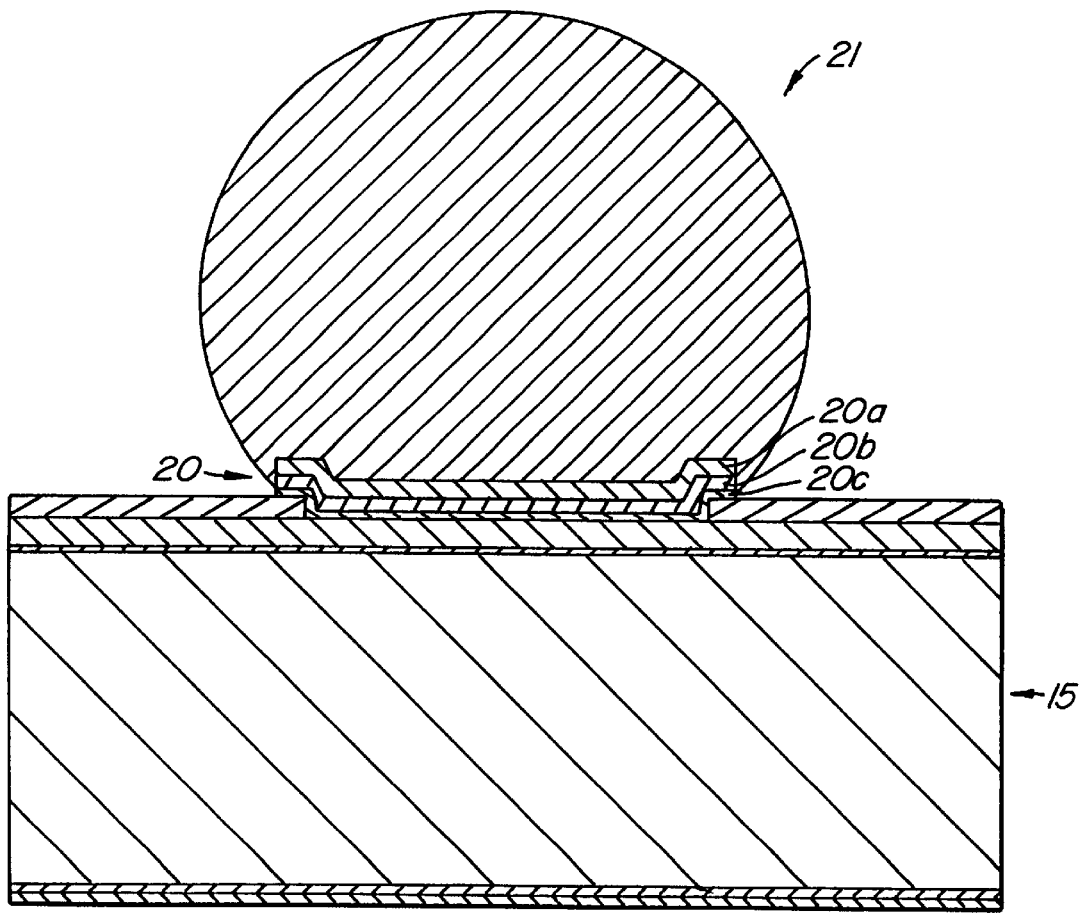
FIG. 6 is a side sectional view of a bumped die.

A die 15 is placed on die attach area 11 in order to complete the semiconductor device. Die 15 is preferably a one-piece item that is often referred to in the art as a "bumped die." As can be seen in FIG. 6, a bumped die includes die 15, "under bump" material that serves as intermediate layer 20 between the top surface of the die and solder bump 21, and the solder bumps themselves. Preferably, the under bump material is one of TiW, Cu, Au or an equivalent. In the example illustrated in FIG. 6, the under bump material is broken into three layers—Cu plating 20a, sputtered Cu 20b, and sputtered Ti 20c.

Preferably, the leadframe consists of a flat, thermally and electrically conductive Cu-based material as the substrate. Examples of electrically conductive material include EFTEC 35, TAMAC2 or K81. Preferably, a Ni—Pd plating is coated on at least the surface of the leadframe in order to allow better solder adhesion. Preferably, solder columns 14 include a solder alloy composition that has a high melting point. Preferably, the melting point is in a range of 300–315° C.

Figure 2:
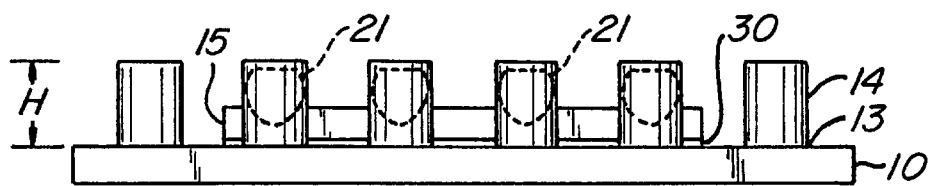
FIG. 2 is side view illustrating the semiconductor device package of FIG. 1.

As can be seen in FIG. 2, the height H of each column is substantially equal to the bond line thickness 30 (from bonding die 15 to surface 12) plus the die thickness plus bump 21's height as measured from the substrate surface.

The package as constructed according to this embodiment of the present invention is particularly suitable for housing a power MOSFET, in which case the substrate acts as the drain for the semiconductor device as well as a marking area for the product code, if desired, on the reverse surface opposite surface 12. Accordingly, the solder columns serve as the drain connection for die 15 while solder bumps 21 on the die serve as the source and gate connections.

Figure 4:
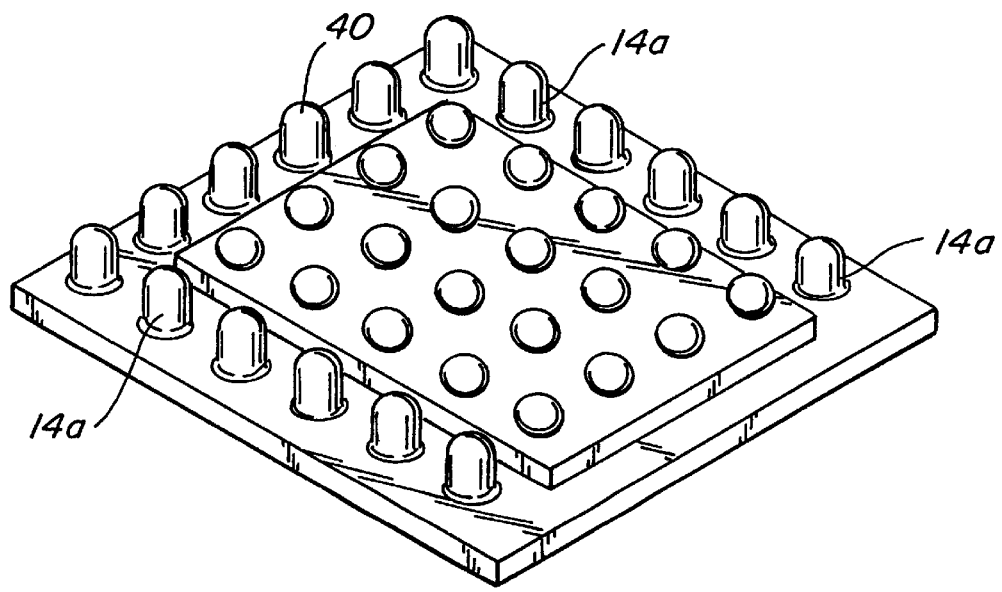
FIG. 4 is a perspective view of a semiconductor device package in accordance with another embodiment of the present invention.
Figure 5:
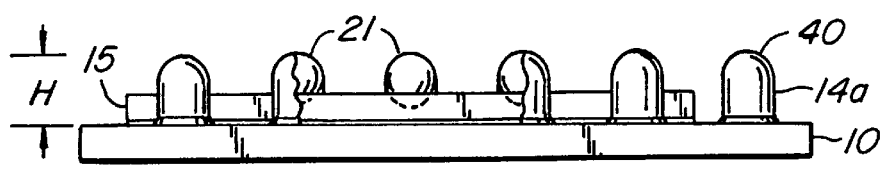
FIG. 5 is a side view of the semiconductor device package illustrated in FIG. 4.

FIGS. 4 and 5 illustrate an alternative embodiment wherein columns 14a consist of a solderable stud metal grown from the substrate. Thus, in this embodiment, solder 40 is placed on the top of the metal studs. Once again, as can be seen in FIG. 5, the height of the metal studs, including the solder on the top, is substantially equal to the bond line thickness plus the die thickness plus the solder bump thickness. Once again, the substrate, and thus the metal studs, serve as the drain connections while solder bumps 21 on the die serve as the source and gate connections. The product marking may be placed on the reverse side of the substrate opposite surface 12.

As can be seen in FIG. 4, in the embodiment with the grown metal studs, the metal studs are preferably only around three sides of the die as opposed to all four sides of die 15. This provides easy access in routing traces in the PCB (printed circuit board).

Thus, the present invention provides a configuration that allows directly attaching a bumped die onto the leadframe using conventional soft solder die attach processes. The solder bumps on the die act as the source and gate connections to the printed circuit board and the solderable columns on the leadframe act as the drain interconnect. Such a package design results in a less complicated substrate processing and still maintains a package stand-off height less than 1 millimeter.

With the present invention, fabrication of the substrate is easily done and tolerances are easily met. In the embodiment with the notches, the cylindrical notch has 30% more area in contact with the solder column and hence a higher peak fatigue resistance. Additionally, the notches serve as a die placement guide.

Nickel and palladium are preferably coated on the surface where wetability is necessary for better solder adhesion. Preferably, the opposite side of the leadframe is plated with only nickel or other equivalent materials, for example gold. This results in a lower material cost since the amount of palladium used is reduced by as much as 50% or more. The nickel still protects the backside portion of the leadframe since it is not easily oxidized.

Additionally, the electrically conductive solder columns or the stud metal columns grown from the substrate act as a thermal path during application. This provides for better heat transfer capabilities since heat is dissipated directly from the die back to the package (substrate) and also to the electrically conductive solder columns or metal studs.

Additionally, in the case of metal studs being grown from the substrate, the solder reflow process is eliminated and thus, leads to a shorter overall manufacturing process and hence an improvement in productivity and minimal process variables.

Although the invention has been described with reference to specific exemplary embodiments, it will be appreciated that it is intended to cover all modifications and equivalents within the scope of the appended claims.

What is claimed is:

1. A semiconductor device comprising:
   a. a die including solder bumps thereon;
   b. a leadframe and a die pad on a surface of the leadframe; and
   c. a plurality of columns on at least a portion of the periphery of the die pad;
   d. wherein the die is positioned within the die pad and is attached thereon; and
   e. wherein the columns have a height substantially equal to the solder bumps and the die on the leadframe.

2. The semiconductor device of claim 1 wherein the leadframe comprises a Cu-based material.

3. The semiconductor device of claim 2 wherein the leadframe includes a Ni—Pd plating on the surface.

4. The semiconductor device of claim 3 wherein the columns comprise metal studs grown from the leadframe that include a solderable coating.

5. The semiconductor device of claim 3 wherein the leadframe includes notches defined in the surface around the periphery and the columns consist of solder placed in the notches.

6. The semiconductor device of claim 1 wherein the die is a bumped die.

7. A method of making a semiconductor device, the method comprising:
   providing a die;
   providing a plurality of solder bumps on the die
   providing a leadframe including a die attach area;
   providing a plurality of columns on at least a portion of a periphery of the die pad; and
   placing the die onto the die attach area;
   wherein the columns have a height substantially equal to the solder bumps and the die on the leadframe.

8. The method of claim 7 wherein the die provided is a bumped die.

9. The method of claim 7 wherein the columns are grown from the leadframe.

10. The method of claim 7 wherein notches are defined within the periphery, and the columns comprise of solder and are placed in the notches.

11. The method of claim 7 further comprising providing a Ni—Pd plating on a surface of the leadframe.

12. The method of claim 11 wherein the leadframe comprises of a Cu-based material and the columns are grown from the Cu-based material.

* * * * *